(12) United States Patent
Yoshikawa et al.

(10) Patent No.: US 6,323,756 B1
(45) Date of Patent: Nov. 27, 2001

(54) DATA TRANSMITTER

(75) Inventors: Takefumi Yoshikawa; Toru Iwata; Hiroyuki Yamauchi, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/486,868

(22) PCT Filed: Jan. 9, 1998

(86) PCT No.: PCT/JP98/03896

§ 371 Date: May 26, 2000

§ 102(e) Date: May 26, 2000

(87) PCT Pub. No.: WO99/12262

PCT Pub. Date: Mar. 11, 1999

(30) Foreign Application Priority Data

Sep. 2, 1997 (JP) .................................................. 9-236782

(51) Int. Cl.[7] .................................................. H04M 11/04
(52) U.S. Cl. .............................. 340/310.01; 340/310.05; 370/282
(58) Field of Search ........................ 340/310.01, 310.05, 340/310.07, 660; 375/259, 257; 370/278, 282; 326/82, 84, 86, 30, 18, 90, 60

(56) References Cited

U.S. PATENT DOCUMENTS

| | | |
|---|---|---|
| 3,657,478 | 4/1972 | Andrews, Jr. . |
| 4,450,370 | 5/1984 | Davis . |
| 4,623,871 * | 11/1986 | Akano ................ 340/310.01 |
| 5,363,332 | 11/1994 | Murabayashi et al. . |
| 5,398,025 * | 3/1995 | Herman ................... 340/660 |
| 5,604,450 | 2/1997 | Borkar et al. . |
| 5,635,896 * | 6/1997 | Tinsley ............... 340/310.05 |
| 5,646,552 | 7/1997 | Ota . |
| 5,952,914 * | 9/1999 | Wynn ................. 340/310.01 |
| 6,150,922 * | 11/2000 | Ackand ............... 340/286.01 |
| 6,154,488 * | 11/2000 | Hunt ....................... 375/219 |

FOREIGN PATENT DOCUMENTS

| | | |
|---|---|---|
| 196 52 305 A1 | 6/1997 | (DE) . |
| 62-136145 | 6/1987 | (JP) . |
| 63-131436 | 8/1988 | (JP) . |
| 4-315335 | 11/1992 | (JP) . |
| 07221624 | 8/1995 | (JP) . |

OTHER PUBLICATIONS

Supplemental European Search Report dated Dec. 29, 2000.

* cited by examiner

Primary Examiner—Jeffery Hofsass
Assistant Examiner—Anh La
(74) Attorney, Agent, or Firm—Snell and Wilmer; Michael K. Kelly

(57) ABSTRACT

The data transmission device 1a of the present invention includes a driver 10 for sending data, a receiver 20 for receiving the data sent from the driver 10, a transmission line path 30 for connecting between the driver 10 and the receiver 20, and a variable impedance element 40 having a controllably variable impedance. The variable impedance element 40 is connected to the transmission line path 30. The data transmission line device 1a can reduce power consumption and occurrence of skew.

13 Claims, 13 Drawing Sheets

DATA TRANSMITTER

TECHNICAL FIELD

The present invention relates to a data transmission device for transmitting data from a driver to a receiver via a transmission line path.

BACKGROUND ART

FIG. 11 shows a configuration of a conventional data transmission device 200. The data transmission device 200 includes a driver 210 for sending data, a receiver 220 for receiving the data sent from the driver 210, and a transmission line path 230 for connecting between the driver 210 and the receiver 220. Data is transmitted via the transmission line path 230 from the driver 210 to the receiver 220.

The driver 210 includes an output buffer 212 for outputting data onto the transmission line path 230. The output buffer 212 is connected via a pad 214 to the transmission line path 230.

The receiver 220 includes an input buffer 222 for receiving data from the transmission line path 230. One input terminal of the input buffer 222 is connected via a pad 224 and a stub resistor 232 to the transmission line path 230.

An end of a terminator resistor 240 is connected to an end on the receiver 220 side of the transmission line path 230. The other end of the terminator resistor 240 is connected to a terminator potential $V_{term}$.

The amplitude of a data signal on the transmission line path 230 is determined by the resistance of the terminator resistor 240 and the output impedance of the driver 210. Therefore, with an appropriate setting of the resistance of the terminator resistor 240 and the output impedance of the driver 210, the amplitude of the data signal on the transmission line path 230 can be limited to a sufficiently small value.

The resistance of the terminator resistor 240 is typically set so as to be substantially equal to the characteristic impedance Z of the transmission line path 230. This prevents data sent from the driver 210 from being reflected at the end on the receiver 220 side of the transmission line path 230.

However, the use of the terminator resistor 240 for terminating the transmission line path 230 causes a problem such that there is power consumption in the absence of data transmission on the transmission line path 230. This is because when data is held at a HIGH level, a direct current ($I_{sink}$) flows from the terminator potential $V_{term}$ to the driver 210 via the terminator resistor 240; and when data is held at a LOW level, a direct current ($I_{source}$) flows from the driver 210 to the terminator potential $V_{term}$ via the terminator resistor 240.

Also, in the presence of data transmission, since a direct current flows via the terminator resistor 240, the slopes of a waveform showing the transition of the potential of the transmission line path 230 becomes mild as the potential difference between the potential of the transmission line path 230 and the terminal potential $V_{term}$ is increased (see FIG. 12). This often causes skew.

Further, the output impedance of the driver 210 when the driver 210 outputs data of the HIGH level is not always in agreement with the output impedance of the driver 210 when the driver 210 outputs data of the LOW level. When these are not in agreement with each other, the absolute value of the direct current ($I_{source}$) flowing from the driver 210 to the terminal potential $V_{term}$ is not identical to the absolute value of the direct current ($I_{sink}$) flowing from the terminal potential $V_{term}$ to the driver 210. Therefore, the value of the potential amplitude of the transmission line path 230 from the terminal potential $V_{term}$ when the driver 210 outputs the HIGH level data is different from the value of the potential amplitude of the transmission line path 230 from the terminal potential $V_{term}$ when the driver 210 outputs the LOW level data.

This means that the terminal potential $V_{term}$ is shifted from a middle value between a potential (Hi-potential) corresponding to the HIGH level data and a potential (Lo-potential) corresponding to the LOW level data. For instance, in an example shown in FIG. 12, the terminal potential $V_{term}$ is 1.1 V; the Hi-potential is 1.5 V; and the Lo-potential is 0.8 V.

The receiver 220 determines whether data on the transmission line path 230 has the HIGH level or the LOW level using the terminal potential $V_{term}$ as a reference potential. Therefore, when the terminal potential $V_{term}$ is shifted from the middle value of the Hi-potential and the Lo-potential, the time which it takes data to transit from the LOW level to the HIGH level is different from the time which it takes data to transit from the HIGH level to the LOW level. This is responsible for skew occurring when the receiver 220 latches data on the transmission line path 230 in synchronization with a predetermined clock signal.

An object of the present invention is to provide a data transmission device in which power consumption is reduced.

Another object of the present invention is to provide a data transmission device in which occurrence of skew is prevented.

DISCLOSURE OF THE INVENTION

A data transmission device according to the present invention includes a driver for sending data; a receiver for receiving data sent from the driver; a transmission line path for connecting between the driver and the receiver; and a variable impedance element having a controllably variable impedance. The variable impedance element is connected to the transmission line path.

According to this invention, by controlling the impedance value of the variable impedance element, a reduction in power consumption and prevention of skew occurrence can be optimized.

For example, when the data transmission device is operated at a low speed, skew is unlikely to occur. Therefore, in this case, the impedance value of the variable impedance element is controlled in such a manner as to decrease the impedance value of the variable impedance element. This prevents a direct current from flowing through the transmission line path. As a result, power consumed by the data transmission device can be reduced. When the data transmission device is operated at a high speed, skew is likely to occur. Therefore, in this case, the impedance value of the variable impedance element is controlled in such a manner as to agree with the impedance of the transmission line path. This prevents data from being reflected at an end of the transmission line path. As a result, occurrence of skew is prevented.

The impedance value of the variable impedance element may be changed according to a potential of the transmission line path.

For example, when the potential difference between the potential of the transmission line path and the terminal potential is less than a predetermined value, the impedance value of the variable impedance element may be controlled in such a manner as to increase the impedance value of the variable impedance element. This allows data to transit from a LOW-level to a HIGH-level (or the HIGH-level to the LOW-level) at a high speed. Further, when the potential difference between the potential of the transmission line path and the terminal potential is greater than a predetermined value, the impedance value of the variable impedance element may be controlled in such a manner as to decrease the impedance value of the variable impedance element. This restricts the amplitude of data and prevents data reflection.

The impedance value of the variable impedance element may be changed according to a control signal input from the outside of the variable impedance element.

For example, when data is transmitted data high speed, a control signal which demands that the impedance value of the variable impedance element is set to a low value is input to the variable impedance element. The variable impedance element decreases the impedance in response to the control signal. This prevents data from being reflected at an end of the transmission line path. As a result, occurrence of skew is prevented. Further, when data transmission is on standby or data is transmitted at a low speed, a control signal which demands that the impedance value of the variable impedance element is set to a high value is input to the variable impedance element. The variable impedance element increases the impedance in response to the control signal. This prevents a direct current from flowing through the transmission line path. As a result, power consumed by the data transmission device can be reduced.

The impedance value of the variable impedance element and an output impedance of the driver may be changed in association with each other. In particular, the output impedance of the driver may be changed according to the impedance value of the variable impedance element.

For example, when data transmission is on standby or data is transmitted at a low speed, the impedance value of the variable impedance element is set to a high value. The output impedance of the driver is set to a high value in response to that the impedance value of the variable impedance element has been set to a high value. This makes it possible that the level of a Hi-potential corresponding to the HIGH-level data and the level of a Lo-potential corresponding to the LOW-level data are substantially equal to values which are obtained when the impedance value of the variable impedance element is set to the low value. This makes it easy to determine whether transmitted data is at the HIGH level or at the LOW level.

The variable impedance element may include a first diode and a second diode connected in parallel. A direction of a current flowing through the first diode is opposite to a direction of a current flowing through the second diode.

This variable impedance element has an extremely high impedance value until either of the first or second diode is biased in the forward direction. This variable impedance element has an extremely low impedance value when either of the first or second diode is biased in the forward direction.

Since the potential of the transmission line path is clamped with the first and second diodes, the potential of the transmission line path transits between a potential ($V_{term}+V_f$) and a potential ($V_{term}-V_f$) where $V_{term}$ is the terminal potential and is at the middle of the two potentials; and $V_f$ is the forward direction voltage of the first and second diodes. For this reason, a time in which data transits from the LOW level to the HIGH level becomes substantially equal to a time in which data transits from the HIGH level to the LOW level. As a result, occurrence of skew is unlikely to occur.

Further, the impedance value of the variable impedance element is set to a high value during the time period of the data transition. For this reason, a drive load which is applied to the driver during the time period of the data transmission is only the capacitance of the transmission line path. Therefore, data transits at a constant high speed. This plays a role in prevention of skew occurrence.

The variable impedance element may further include a resistor connected in series to the first and second diodes connected in parallel.

Adjustment of the resistance of the resistor can adjust the impedance when the first or second diode is biased in the forward direction.

A resistance of the resistor may be substantially equal to a characteristic impedance of the transmission line path; and a forward direction voltage of the first and second diodes may be substantially equal to an amplitude of a potential of the transmission line path from a predetermined terminal voltage, the amplitude being generated when the driver outputs the data onto the transmission line path.

Thus, by setting the resistance of the resistor and the forward direction voltage of the first and second diodes, the impedance value of the variable impedance element in a state such that either the first or second diode is biased in the forward direction is substantially equal to the characteristic impedance of the transmission line path. This can prevent data reflection effectively. Further, even when either of the first or second diode is biased in the forward direction, the amplitude of the potential of the transmission line path from the terminal potential is substantially in agreement with the forward direction voltage of the first and second diodes. For this reason, the time in which data transits from the LOW level to the HIGH level and the time in which data transits from the HIGH level to the LOW level become substantially equal to each other. As a result, skew is unlikely to occur.

Another data transmission device according to the present invention includes a driver for sending data; a receiver for receiving data sent from the driver; first and second transmission line paths for connecting between the driver and the receiver; a first variable impedance element having a first controllably variable impedance; and a second variable impedance element having a second controllably variable impedance. The first variable impedance element is connected to the first transmission line path, and the second variable impedance element is connected to the second transmission line path.

According to this invention, by controlling the impedance value of the first variable impedance element and the impedance value of the second variable impedance element, a reduction in power consumption and prevention of skew occurrence can be optimized.

The first variable impedance element may include first and second diodes; the anode of the first diode may be connected to a predetermined first potential; the cathode of the first diode may be connected to the first transmission line path; the anode of the second diode may be connected to the first transmission line path; and the cathode of the second diode may be connected to a predetermined second potential lower than the predetermined first potential: the sum of the forward direction voltages of the first and second diodes may be greater than a potential difference between the predetermined first potential and the predetermined second potential; the second variable impedance element includes third and fourth diodes; the anode of the third diode may be connected to a predetermined third potential; the cathode of the third diode may be connected to the second transmission line path; the anode of the fourth diode may be connected to the second transmission line path; and the cathode of the fourth diode may be connected to a predetermined fourth potential lower than the predetermined third potential; and the sum of the forward direction voltages of the third and fourth diodes may be greater than a potential difference between the predetermined third potential and the predetermined fourth potential.

With the first variable impedance element so constructed, when the potential of the transmission line path is between the potential ($V_{term1}-V_f$) and the potential ($V_{ss}+V_f$), the transmission line path is connected to the potential $V_{term1}$ or the potential $V_{SS}$ via the element having an extremely high impedance. Here, $V_{term1}$ denotes the first potential, $V_{SS}$ denotes the second potential, and $V_f$ denotes the forward voltage of the first and second voltages. For this reason, data transits at a high speed.

Further, when the potential of the transmission line path becomes less than the potential ($V_{term1}-V_f$) or greater than ($V_{ss}+V_f$), the first or second diode is biased in the forward direction, whereby the transmission line path is connected to the potential $V_{term1}$ or the potential $V_{SS}$ via the element having an extremely low impedance. For this reason, the level of a Hi-potential corresponding to the HIGH-level data and the level of a Lo-potential corresponding to the LOW-level data are clamped around the potential ($V_{term1}-V_f$) or the potential ($V_{ss}+V_f$). This restricts the amplitude of data.

The same applies to the second variable impedance element.

Thus, data transit at a high speed and the amplitude of data is restricted. As a result, it is possible to obtain high-speed data transmission where skew is unlikely to occur.

BEST MODE FOR CARRYING OUT THE INVENTION

Hereinafter, examples of the present invention will be described with reference to the accompanying drawings.

EXAMPLE 1

Figure 1:
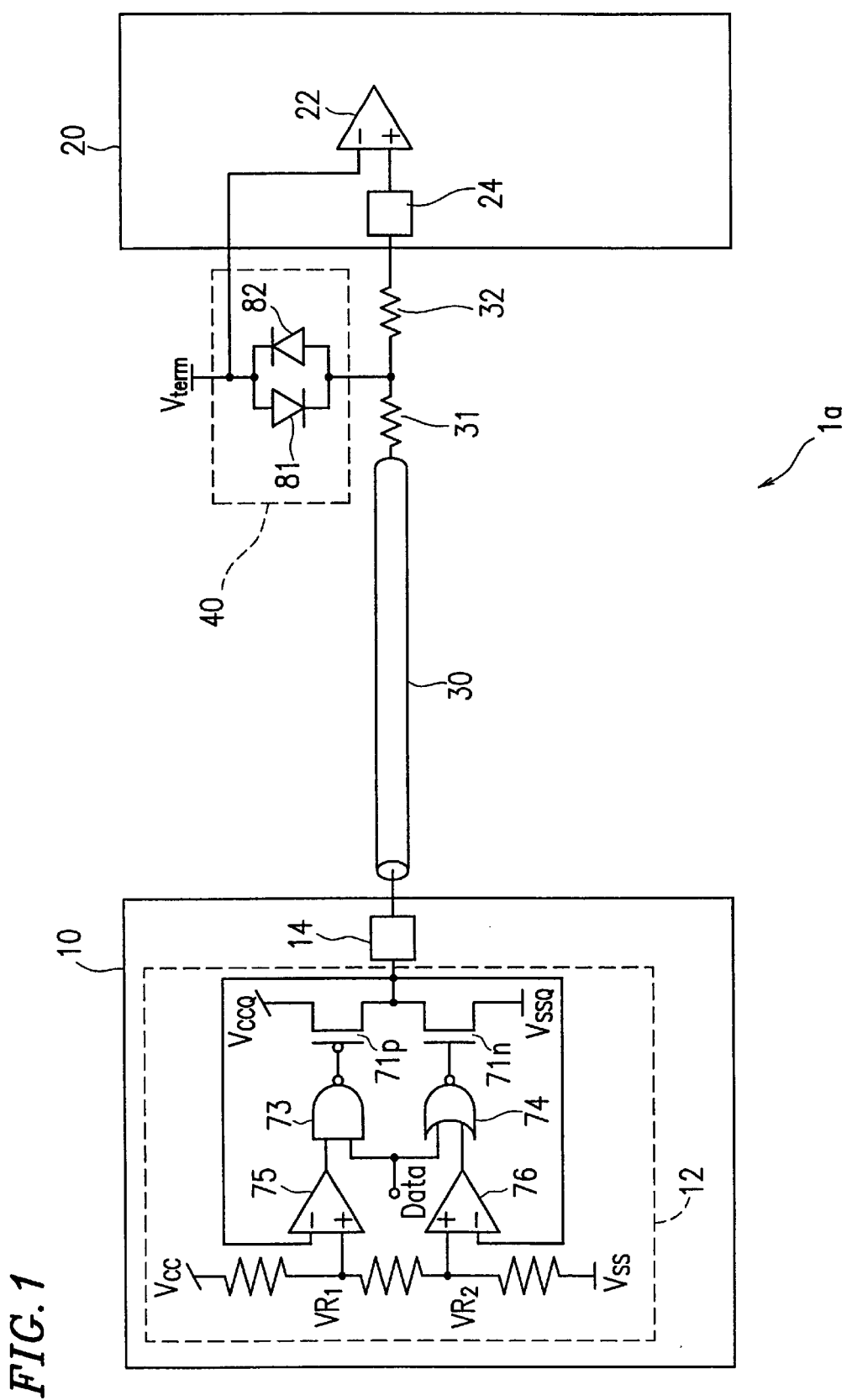
FIG. 1 is a diagram showing a configuration of a data transmission device 1a according to Example 1 of the present invention.

FIG. 1 shows a configuration of a data transmission device 1a according to Example 1 of the present invention. The data transmission device 1a includes a driver 10 for sending data, a receiver 20 for receiving the data sent from the driver 10, and a transmission line path 30 for connecting between the driver 10 and the receiver 20. The data is transmitted from the driver 10 to the receiver 20 via the transmission line path 30. Each of the driver 10 and the receiver 20 is, for example, a semiconductor integrated circuit.

The data transmission device 1a further includes a variable impedance element 40 the impedance value of which varies automatically according to the potential of the transmission line path 30. One end of the variable impedance element 40 is connected to an end on the receiver 20 side of the transmission line path 30. The other end of the variable impedance element 40 is connected to a terminal potential $V_{term}$.

The driver 10 includes an output buffer 12 for outputting data onto the transmission line path 30. The output buffer 12 is connected via a pad 14 to the transmission line path 30.

In the example shown in FIG. 1, the output buffer 12 is of a push-pull type. The output buffer 12 includes a PMOS transistor 71p and an NMOS transistor 71n. The gates of the transistors 71p and 71n receive predetermined logic values determined by a NAND element 73, a NOR element 74, and operational amplifiers 75 and 76. The operational amplifier 75 receives the potential of the transmission line path 30 and a reference potential $VR_1$. The operational amplifier 76 receives the potential of the transmission line path 30 and a reference potential $VR_2$.

In an initial state, the transistor 71p is in the OFF state, and the transistor 71n is in the OFF state. In this initial state, when data Data having a value '1' is input into the output buffer 12, the transistor 71p is switched ON. The transistor 71n remains in the OFF state. As a result, the potential of the transmission line path 30 is increased to be close to a predetermined potential $V_{CCQ}$. Thereafter, when the potential of the transmission line path 30 becomes more than the reference voltage $VR_1$, the transistor 71p is switched OFF. The transistor 71n remains in the OFF state. This is because when the potential of the transmission line path 30 becomes more than the reference potential $VR_1$, the output of the operational amplifier 75 goes to the LOW level and, as a result, the gate of the transistor 71p goes to the HIGH level.

In an initial state, the transistor 71p is in the OFF state, and the transistor 71n is in the OFF state. In this initial state, when data Data having a value '0' is input into the output buffer 12, the transistor 71n is switched ON. The transistor 71p remains in the OFF state. As a result, the potential of the transmission line path 30 is decreased to be close to a predetermined potential $V_{SSQ}$. Thereafter, when the potential of the transmission line path 30 becomes less than the reference voltage $VR_2$, the transistor 71n is switched OFF. The transistor 71p remains in the OFF state. This is because when the potential of the transmission line path 30 becomes less than the reference potential $VR_2$, the output of the operational amplifier 76 goes to the HIGH level and, as a result, the gate of the transistor 71n goes to the LOW level.

As described above, the output buffer 12 of the driver 10 switches OFF the transistor 71p when the potential of the transmission line path 30 becomes greater than the reference potential $VR_1$, and switches OFF the transistor 71n when the potential of the transmission line path 30 becomes less than the reference potential $VR_2$.

The receiver 20 includes an input buffer 22 for receiving data from the transmission line path 30. The input buffer 22 is, for example, an operational amplifier having two input terminals.

One input terminal of the input buffer 22 is connected via a pad 24, a stub resistor 32, and a resistor 31 to the transmission line path 30. The other input terminal of the input buffer 22 is connected to the terminal potential $V_{term}$. The terminal potential $V_{term}$ is, for example, 1.1 V.

The input buffer 22 determines whether data on the transmission line path 30 has the HIGH level or the LOW level using the terminal potential $V_{term}$ as a reference potential. Thus, the input buffer 22 receives the data sent from the output buffer 12.

Note that a node which has the same potential as that of the terminal potential $V_{term}$ may be provided separately from the terminal potential $V_{term}$. In this case, using the potential of this node as a reference potential, the input buffer 22 can determine whether data on the transmission line path 30 has the HIGH level or the LOW level. Therefore, the input buffer 22 is unaffected by the noise of the terminal potential $V_{term}$.

A variable impedance element 40 includes a diode 81 and a diode 82 which are connected to each other in parallel. The direction (forward direction) of a current flowing through the diode 81 is opposite to the direction (forward direction) of a current flowing through the diode 82.

When the potential of the transmission line path 30 is around the terminal potential $V_{term}$, the diodes 81 and 82 are not biased in the forward direction. Therefore, the potential of the transmission line path 30 is around the terminal potential $V_{term}$, and the impedance value of the variable impedance element 40 is much increased.

When the output buffer 12 outputs HIGH-level data onto the transmission line path 30 so that the potential of the transmission line path 30 is increased to $(V_{term}+V_f)$, the diode 82 is biased in the forward direction. As a result, the impedance value of the variable impedance element 40 is much decreased. Here $V_f$ denotes a forward voltage of the diode 81 or 82.

When the output buffer 12 outputs LOW-level data onto the transmission line path 30 so that the potential of the transmission line path 30 is decreased to $(V_{term}-V_f)$, the diode 81 is biased in the forward direction. As a result, the impedance value of the variable impedance element 40 is much decreased.

Figure 2:
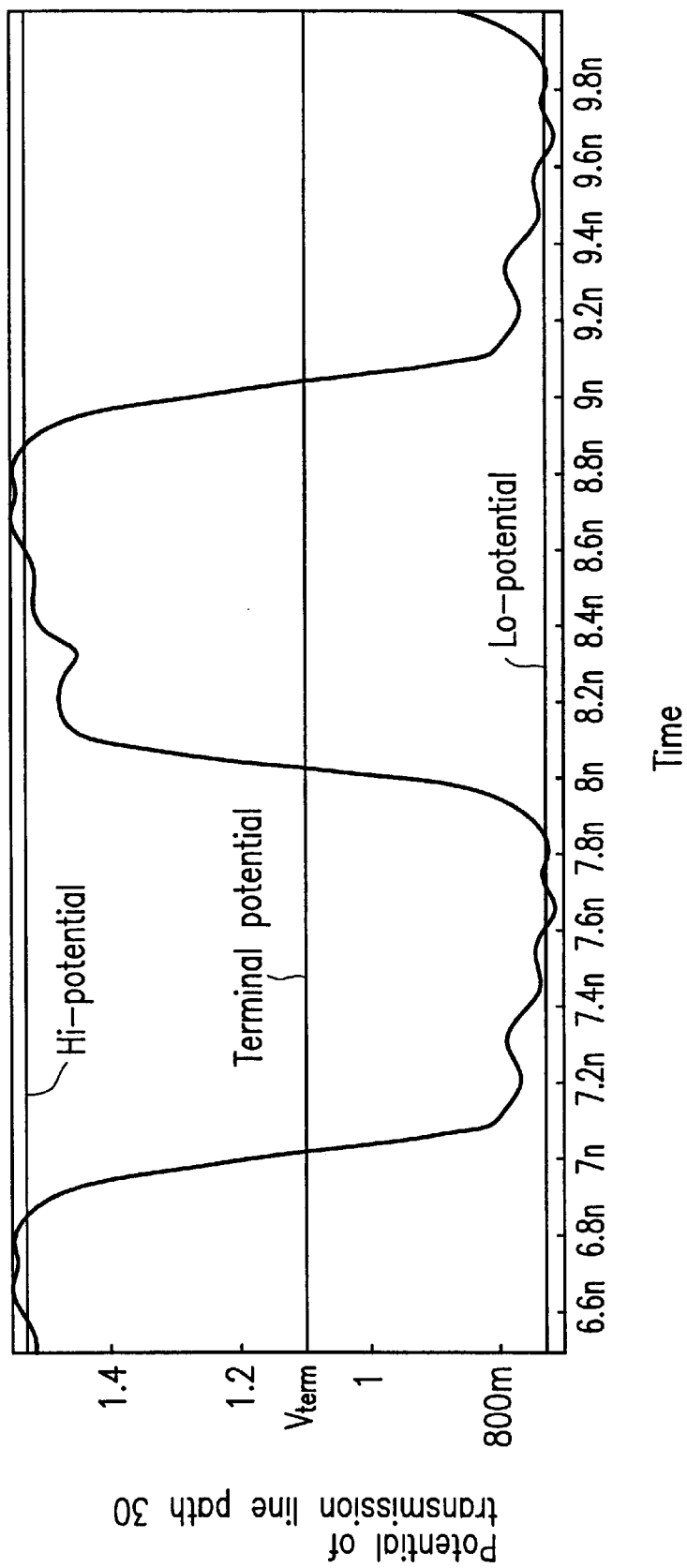
FIG. 2 is a diagram showing transition of the potential of a transmission line path 30 shown in FIG. 1.

FIG. 2 shows transition of the potential of the transmission line path 30 when HIGH-level data and LOW-level data are alternately output from the driver 10.

When data transmitted from the driver 10 is in the transition state, the potential of the transmission line path 30 transits from the HIGH level to the LOW level (or the LOW level to the HIGH level) at a constant high speed. This is because when the potential of the transmission line path 30 is around the terminal potential $V_{term}$, the impedance value of the variable impedance element 40 has a large value so that only a load corresponding to the capacitance of the transmission line path 30 is applied to the output buffer 12 of the driver 10.

On the other hand, when the data transition is completed to some degree so that the potential difference between the potential of the transmission line path 30 and the potential of the terminal voltage $V_{term}$ becomes large, the impedance value of the variable impedance element 40 is decreased. This is because the potential of the transmission line path 30 is increased to $(V_{term}+V_f)$ so that the diode 82 of the variable impedance element 40 is biased in the forward direction; and the potential of the transmission line path 30 is decreased to $(V_{term}-V_f)$ so that the diode 81 of the impedance element 40 is biased in the forward direction. For this reason, an upper limit of the amplitude of data transmitted from the driver 10 is clamped to the potential $(V_{term}+V_f)$ and a lower limit of the amplitude of the data is clamped to the potential $(V_{term}-V_f)$. As described above, the amplitude of the data transmitted from the driver 10 is limited to a predetermined range $(V_{term}-V_f$ to $V_{term}+V_f)$. As a result, it is possible to transmit data having small amplitude.

For example, when the diodes 81 and 82 are Schottky diodes, the forward voltage $V_f$ is about 0.4 V. Therefore, the potential of data on the transmission line path 30 swings between 1.5 V and 0.7 V where the terminal potential $V_{term}$ of 1.1 V is the middle value.

When the data transition is completed, the potential difference between the potential of the transmission line path 30 and the terminal potential $V_{term}$ as a reference potential is substantially equal to the forward voltage $V_f$ of the diodes 81 and 82 of the variable impedance element 40 regardless of the output impedance of the driver 10. This can provide a sufficient potential difference between the potential of the transmission line path 30 and the terminal potential $V_{term}$. As a result, the logical determination can be securely performed.

Note that a resistor 31 connected in series between the variable impedance element 40 and the transmission line path 30 is used in order to restrict a current flowing between the terminal potential $V_{term}$ and the driver 10 when the diodes 81 and 82 are biased in the forward direction.

Further, when the reference potentials $VR_1$ and $VR_2$ of the output buffer 12 of the driver 10 are set to around the potentials $(V_{term}+V_f)$ and $(V_{term}-V_f)$, respectively, a direct current flowing between the terminal potential $V_{term}$ and the driver 10 can be removed. This is because when the potential of the transmission line path 30 is the potential $(V_{term}+V_f)$ or the potential $(V_{term}-V_f)$, the transistors 71p and 71n of the output buffer 12 are switched OFF so that the output impedance of the driver 10 becomes very large. In this case, the potential of the transmission line path 30 maintains the potential $(V_{term}+V_f)$ or the potential $(V_{term}-V_f)$ due to the capacitance of the diodes 81 and 82 and the capacitance of the transmission line path 30 itself. Therefore, the potential difference required for the logical determination in the receiver 20 is subsequently held.

Figure 3:
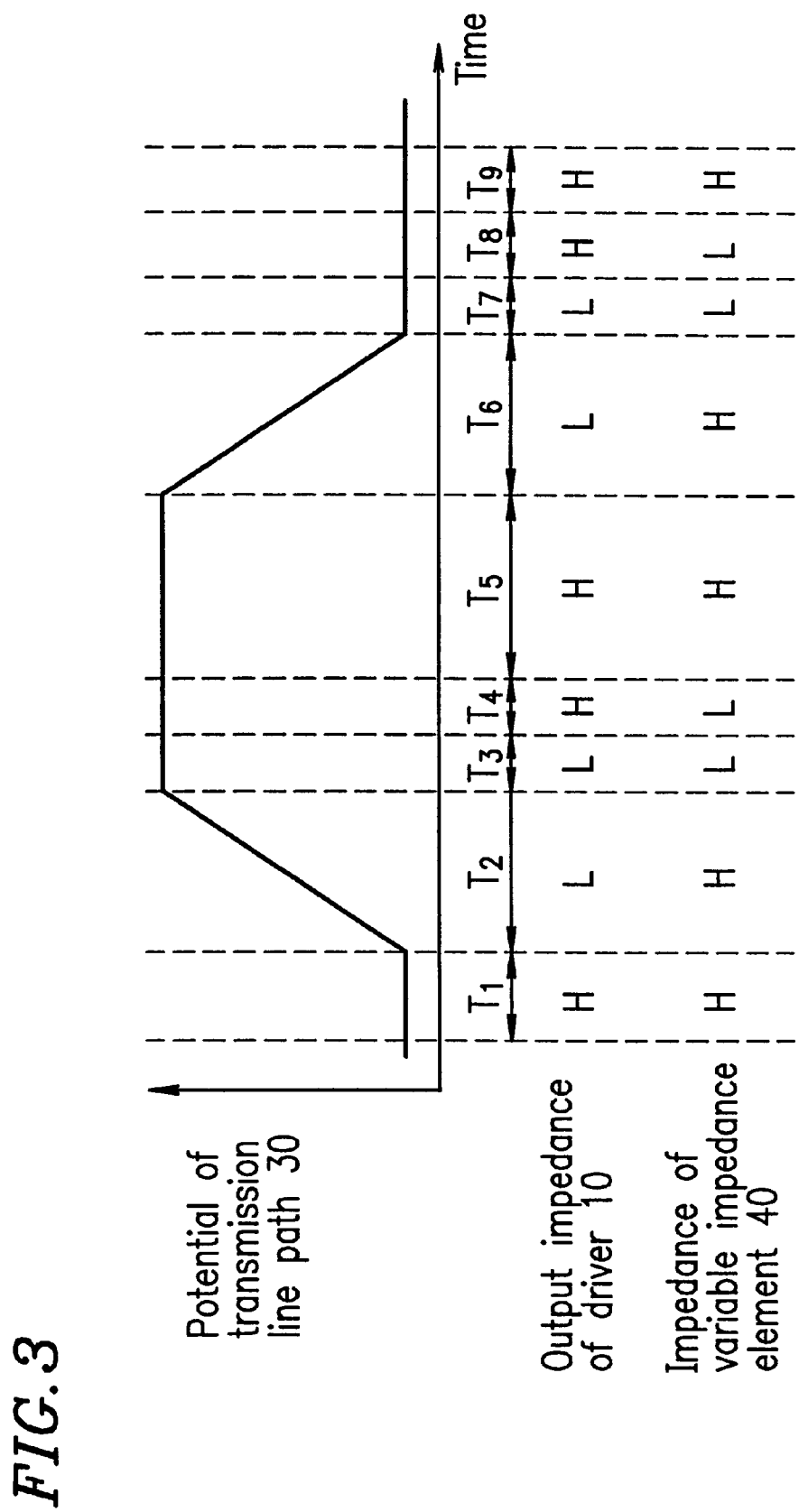
FIG. 3 is a diagram showing a change in the output impedance of a driver 10 and the impedance of a variable impedance element 40 over time.

FIG. 3 shows variations in the output impedance of the driver 10 and the impedance value of the variable impedance element 40 over time. In an example shown in FIG. 3, it is assumed that the output impedance of the driver 10 and the impedance value of the variable impedance element 40 each have one of two values. In FIG. 3, the highest of the two values is represented by 'H' and the lowest is represented by 'L'.

When data on the transmission line path 30 does not transit, both the output impedance of the driver 10 and the impedance value of the variable impedance element 40 are set to 'H' (time period $T_1$). For this reason, a direct current flowing between the driver 10 and the variable impedance element 40 can be removed.

When data on the transmission line path 30 transits from the LOW level to the HIGH level, the output impedance of the driver 10 is set to 'L' (time period $T_2$). For this reason, the potential of the transmission line path 30 transits at a high speed.

Thereafter, the potential of the transmission line path 30 is increased to the potential $(V_{term}+V_f)$ or is decreased to the potential $(V_{term}-V_f)$, and the impedance value of the variable impedance element 40 is set to 'L' (time period $T_3$). For this reason, the transmission line path 30 is terminated so that the transmitted data is not reflected and has small amplitude.

Thereafter, when the potential of the transmission line path 30 becomes greater than the reference potential $VR_1$, or when the potential of the transmission line path 30 becomes less than the reference potential $VR_2$, the output impedance of the driver 10 is set to 'H' (time period $T_4$). This is because when the potential of the transmission line path 30 becomes greater than the reference potential $VR_1$, or when the potential of the transmission line path 30 becomes less than the reference potential $VR_2$, the transistors 71$p$ and 71$n$ of the output buffer 12 both are switched OFF. For this reason, the potential of the transmission line path 30 transits toward the terminal potential $V_{term}$, so that the potential of the transmission line path 30 becomes less than the potential $(V_{term}+V_f)$ or greater than the potential $(V_{term}-V_f)$. As a result, the impedance value of the variable impedance element 40 is set to 'H' (time period $T_5$).

In the time period $T_5$, the output impedance of the driver 10 and the impedance value of the variable impedance element 40 both are set to 'H'. For this reason, a direct current flowing between the driver 10 and the variable impedance element 40 can be removed.

Note that when the reference potential $VR_1$ is set to be equal to the potential $(V_{term}+V_f)$ and the reference potential $VR_2$ is set to be equal to the potential $(V_{term}-V_f)$, the output impedance of the driver 10 changes from 'L' to 'H' while the impedance value of the variable impedance element 40 changes from 'H' to 'L'.

The same applies to the case where data on the transmission line path 30 transits from the HIGH level to the LOW level (time periods $T_6$ to $T_9$).

As described above, the impedance value of the variable impedance element 40 and the output impedance of the driver 10 vary in association with each other.

According to the data transmission device 1$a$, a direct current flowing between the driver 10 and the variable impedance element 40 can be removed. Even when such a direct current is removed, the logic level of data on the transmission line path 30 can be held. This plays a role in a reduction in power consumption in a time period of no data transition.

For example, a probability of data transition is about 10% in the CPU of a computer. Therefore, the effect of the low power consumption is more significant in a time period of no data transition than in a time period of data transition.

Figure 11:
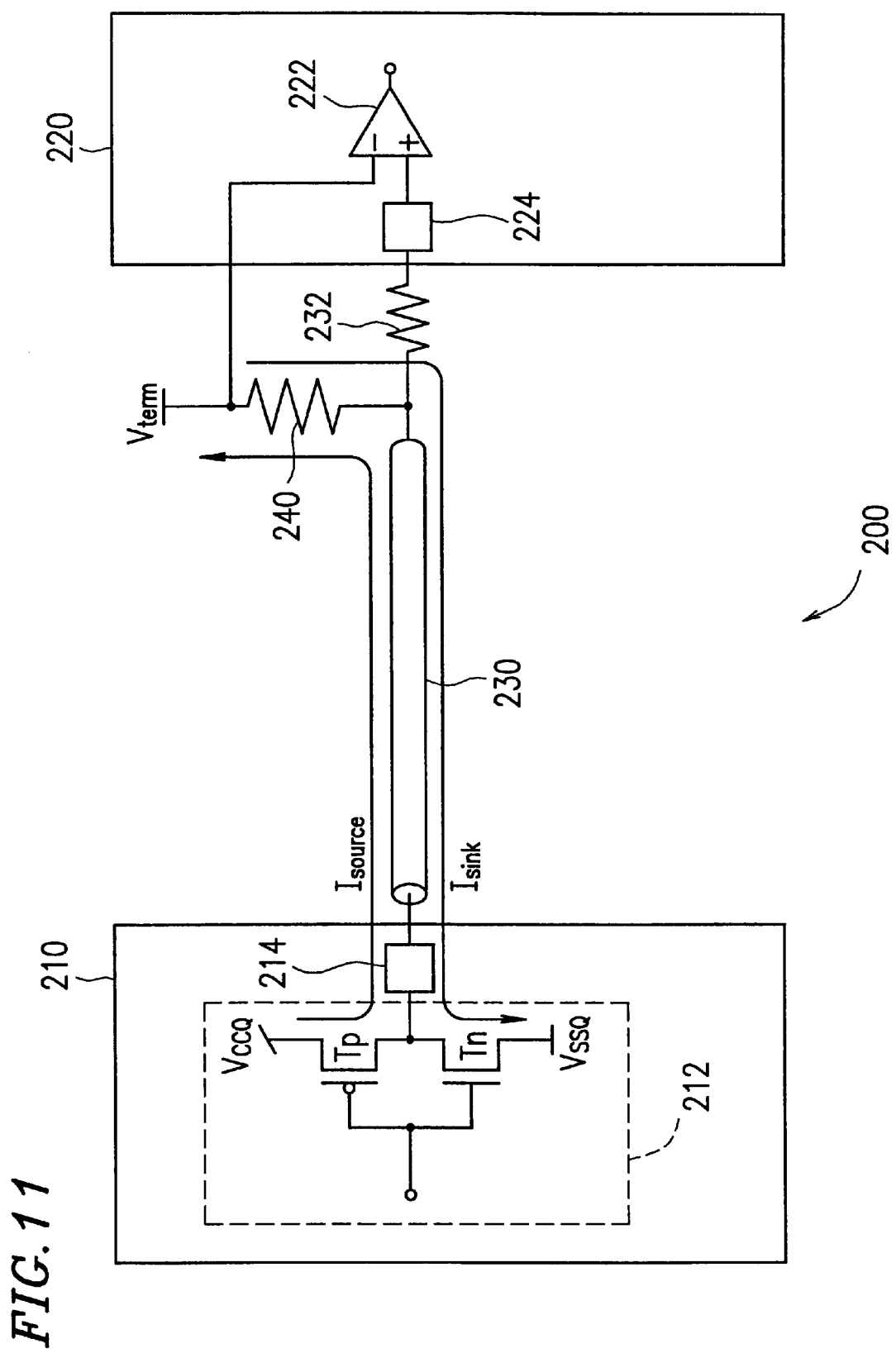
FIG. 11 is a diagram showing a configuration of a conventional data transmission device 200.
Figure 12:
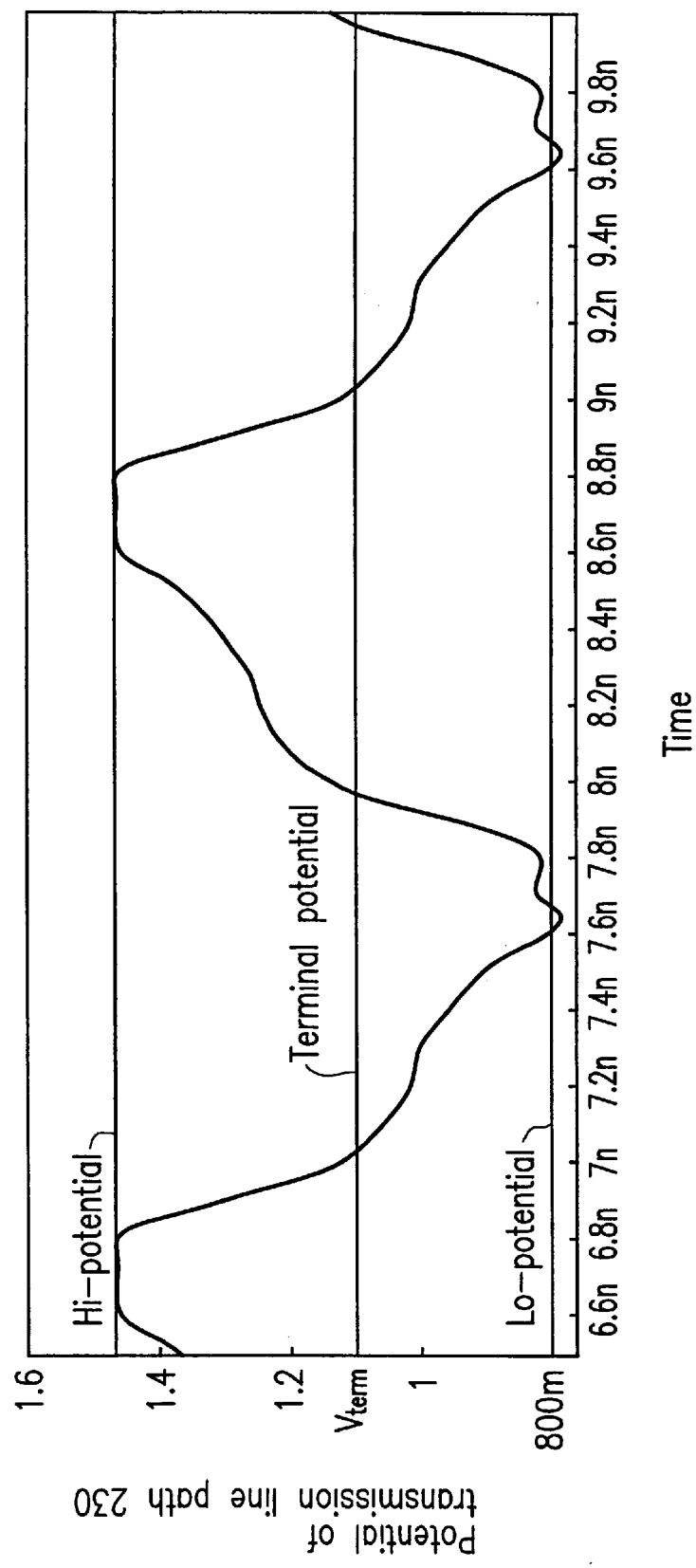
FIG. 12 is a diagram showing transition of the potential of a transmission line path 230 shown in FIG. 11

For example, data having an amplitude of 1 V is transmitted at a frequency of 500 MHz using the conventional data transmission device 200 shown in FIG. 11. In this case, a current consumed by the conventional data transmission device 200 is as follows. Note that it is assumed that the capacitance of the transmission line path 230 is 20 pF, and a direct current flowing through the terminator resistor 240 is 8 mA.

i) alternating current: 1 V×20 pF×500 MHz×10% (transition probability)=1 mA ii) direct current: 8 mA×90% (non-transition probability)=7.2 mA As described above, a direct current component is predominantly consumed in the fast-speed data transmission where the amplitude of data is limited. Therefore, the removal of this direct current component largely contributes to a reduction in power consumption.

Figure 4A:
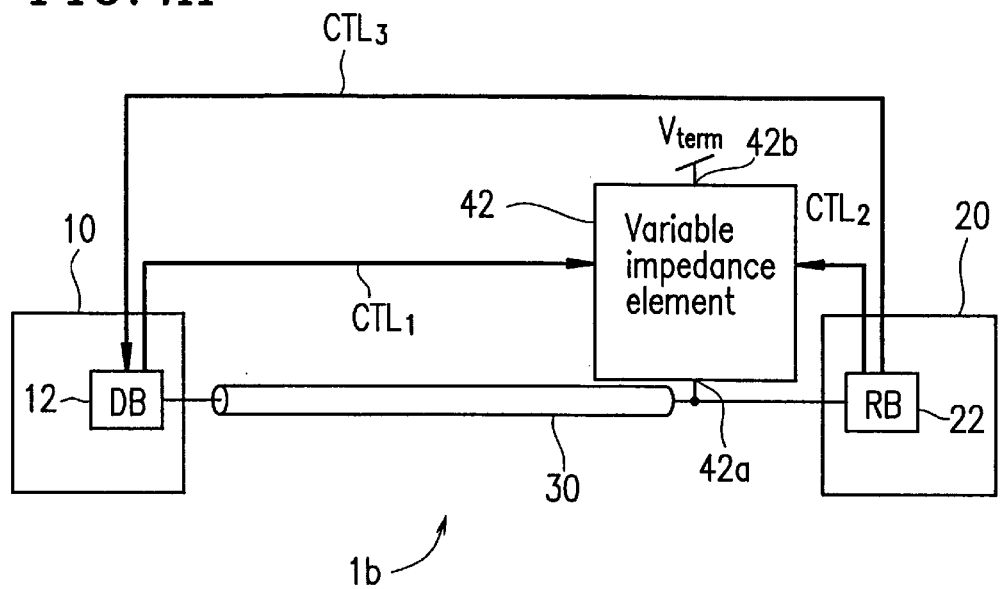
FIG. 4A is a diagram showing a configuration of a data transmission device 1b according to Example 1 of the present invention.

FIG. 4A shows a configuration of a data transmission device 1$b$ according Example 1 of the present invention.

The data transmission device 1$b$ includes a variable impedance element 42 having a variable impedance controlled according to a control signal. One terminal 42$a$ of the variable impedance element 42 is connected to an end on a receiver 20 side of a transmission line path 30. The other terminal 42$b$ of the variable impedance element 42 is connected to a terminator potential $V_{term}$.

The impedance value of the variable impedance element 42 is changed according to control signals $CTL_1$ and $CTL_2$ input from the outside of the variable impedance element 42. The control signal $CTL_1$ is input to the variable impedance element 42 from a driver 10. The control signal $CTL_2$ is input to the variable impedance element 42 from a receiver 20.

The driver 10 includes an output buffer (DB) 12 for outputting data onto the transmission line path 30. The receiver 20 includes an input buffer (RB) 22 for receiving data from the transmission line path 30.

The output buffer 12 controls the variable impedance element 42 so that the fast-speed data transmission and the low power consumption are optimized. For example, before outputting data onto the transmission line path 30, the output buffer 12 controls the variable impedance element 42 in such a manner that the impedance value of the variable impedance element 42 is decreased. For example, the impedance value of the variable impedance element 42 is controlled in such a manner as to be in agreement with the characteristic impedance of the transmission line path 30. These controls are carried out using the control signal $CTL_1$. This makes it possible to transmit data at a high speed. Thereafter, when the data transmission is completed, the output buffer 12 controls the variable impedance element 42 so as to increase the impedance value of the variable impedance element 42. This prevents a direct current from flowing between the variable impedance element 42 and the driver 10. As a result, power consumption by the data transmission device 1$b$ is decreased.

Note that the output buffer 12 is preferably controlled in such a manner that when the impedance value of the variable impedance element 42 is high, the output impedance of the driver 10 is high; and when the impedance value of the variable impedance element 42 is low, the output impedance of the driver 10 is low.

Alternatively, instead of using the output buffer 12, the input buffer 22 may control the impedance value of the variable impedance element 42. For example, when the input buffer 22 is in a standby state where the buffer 22 can receive data from the transmission line path 30, the input buffer 22 controls the variable impedance element 42 in such a manner as to decrease the impedance value of the variable impedance element 42. Such a control is carried out using the control signal $CTL_2$. Thereafter, when the data transmission is completed, the input buffer 22 controls the variable impedance element 42 in such a manner as to increase the impedance value of the variable impedance element 42. This prevents a direct current from flowing between the variable impedance element 42 and the driver 10. As a result, power consumption by the data transmission device 1b is decreased.

Note that the output buffer 12 is preferably controlled in such a manner that when the impedance value of the variable impedance element 42 is high, the output impedance of the driver 10 is high; and when the impedance value of the variable impedance element 42 is low, the output impedance of the driver 10 is low. Such a control is, for example, carried out by supplying a control signal $CTL_3$ into the output buffer 12 from the input buffer 22.

As described above, in the data transmission device 1b, the impedance value of the variable impedance element 42 and the output impedance of the driver 10 are controlled depending on whether data is being transmitted or not. Alternatively, the impedance value of the variable impedance element 42 and the output impedance of the driver 10 may be controlled in a way as shown in FIG. 3. In the control shown in FIG. 3, the state where data is being transmitted is divided into sub states so that the impedance value of the variable impedance element 42 and the output impedance of the driver 10 are more suitably controlled during transmission of data.

Figure 5A:
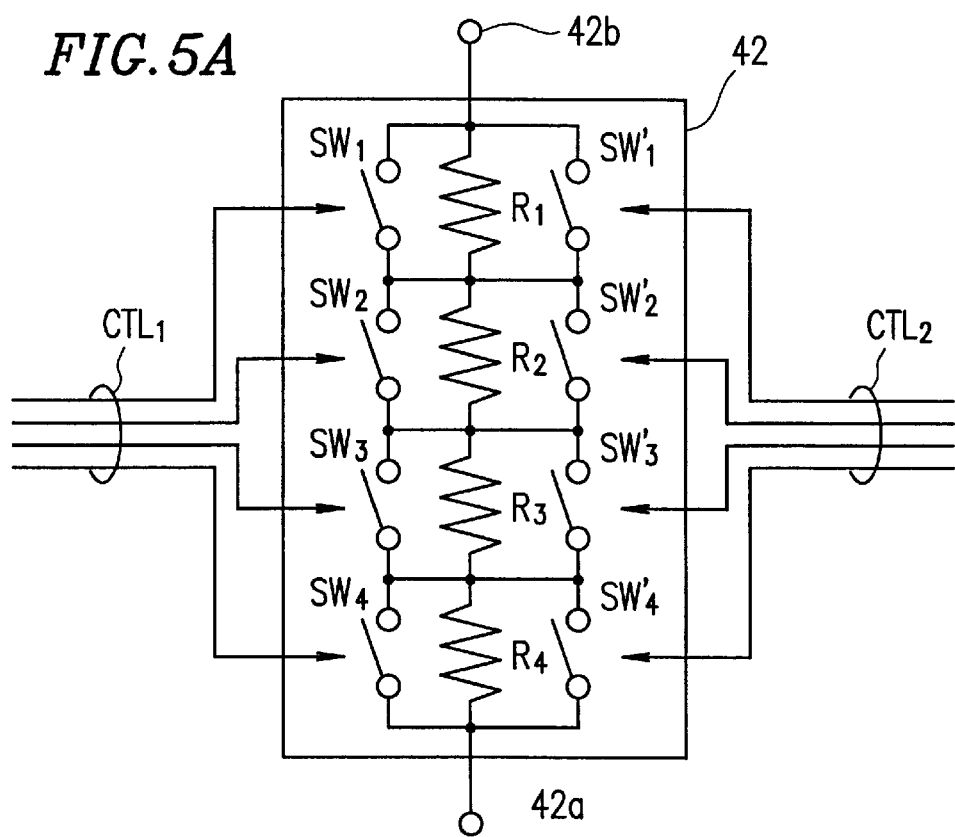
FIG. 5A is a diagram showing a configuration of a variable impedance element 42 shown in FIG. 4A.

FIG. 5A shows a configuration of a variable impedance element 42. The variable impedance element 42 includes resistors $R_1$ to $R_4$ which are connected in series to each other between a terminal 42a and a terminal 42b and switches $SW_1$ to $SW_4$ and $SW'_1$ to $SW'_4$ which are provided for bypass, corresponding to $R_1$ to $R_4$, respectively.

The ON-OFF for the switches $SW_1$ to $SW_4$ is controlled with the control signal $CTL_1$. The ON-OFF for the switches $SW'_1$ to $SW'_4$ is controlled with the control signal $CTL_2$. When the switches $SW'_1$ to $SW'_4$ are all in the OFF state, the impedance value of the variable impedance element 42 can be changed in four levels by switching ON or OFF the switches $SW_1$ to $SW_4$ according to the control signal $CTL_1$. When the switches $SW_1$ to $SW_4$ are all in the OFF state, the impedance value of the variable impedance element 42 can be changed in four levels by switching ON or OFF the switches $SW'_1$ to $SW'_4$ according to the control signal $CTL_2$.

Figure 4B:
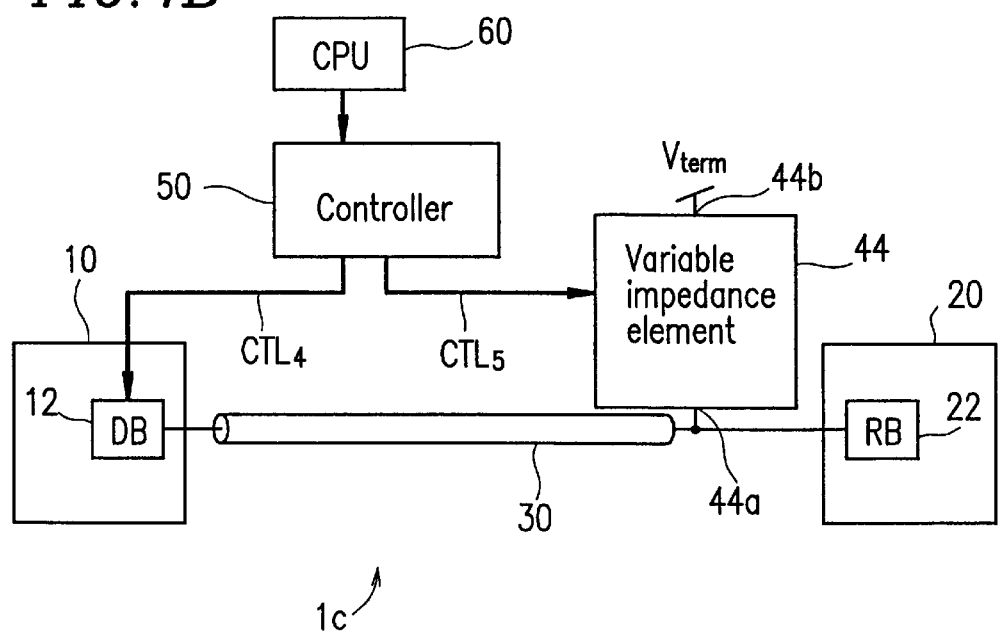
FIG. 4B is a diagram showing a configuration of a data transmission device 1a according to Example 1 of the present invention.

FIG. 4B shows a data transmission device 1c according to Example 1 of the present invention. The data transmission device 1c includes a controller 50 for controlling a variable impedance element 44 in such a manner that the impedance value of the variable impedance element 44 can be changed.

A CPU 60 provides the controller 50 with information indicating an operating speed of the CPU 60. The information indicating an operating speed of the CPU 60 is, for example, information indicating an operating mode of the CPU 60 (e.g., a normal operating mode, a low-power-consumption operating mode, and the like). Alternatively, the information indicating an operating speed of the CPU 60 may be information indicating an operating clock frequency.

The controller 50 determines based on the information provided by the CPU 60 whether the CPU 60 is operated at a high speed or not.

When the CPU 60 is operated at a high speed, the controller 50 controls the variable impedance element 44 in such a manner as to decrease the impedance value of the variable impedance element 44. Such a control of the variable impedance element 44 is carried out using a control signal $CTL_5$. The decreased impedance of the variable impedance element 44 allows high-speed data transmission.

On the other hand, when the CPU 60 is operated at a low speed, the controller 50 controls the variable impedance element 44 in such a manner as to increase the impedance value of the variable impedance element 44. Such a control of the variable impedance element 44 is carried out using the control signal $CTL_5$. The increased impedance of the variable impedance element 44 prevents a direct current from flowing between the variable impedance element 44 and the driver 10. As a result, power consumption by the data transmission device 1c is reduced.

Thus, both high-speed data transmission and low power consumption can be achieved at a system level by adjusting the impedance value of the variable impedance element 44 according to the operating speed of the CPU 60.

Further, when the CPU 60 is operated at a high speed, the controller 50 preferably controls the output buffer 12 in such a manner that the output impedance of the driver 10 is decreased. Such a control of the output buffer 12 is carried out using the control signal $CTL_4$. The decreased output impedance of the driver 10 allows high-speed data transmission. When the CPU 60 is operated at a low speed, the controller 50 preferably controls the output buffer 12 in such a manner that the output impedance of the driver 10 is increased. Such a control of the output buffer 12 is carried out using the control signal $CTL_4$. The increased output impedance of the driver 10 prevents a direct current from flowing between the variable impedance element 44 and the driver 10. As a result, power consumption by the data transmission device 1c is reduced.

Figure 5B:
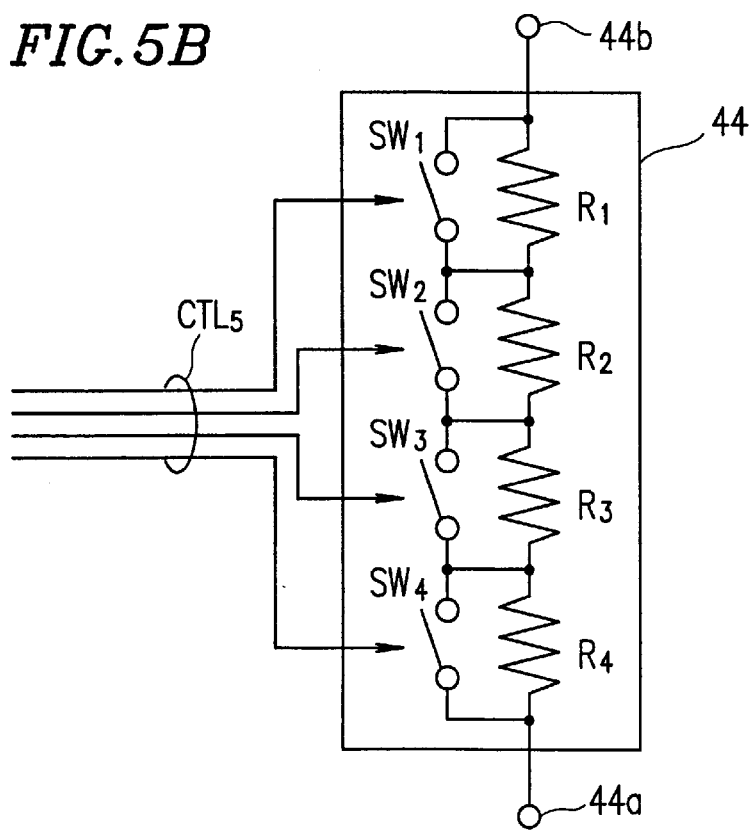
FIG. 5B is a diagram showing a configuration of a variable impedance element 44 shown in FIG. 4B.

FIG. 5B shows a configuration of a variable impedance element 44. The variable impedance element 44 includes resistors $R_1$ to $R_4$ which are connected in series to each other between a terminal 44a and a terminal 44b and switches $SW_1$ to $SW_4$ which are provided for bypass, corresponding to $R_1$ to $R_4$, respectively.

The ON-OFF for the switches $SW_1$ to $SW_4$ is controlled with the control signal $CTL_5$. The impedance value of the variable impedance element 44 can be changed in four levels by switching ON or OFF the switches $SW_1$ to $SW_4$ according to the control signal $CTL_5$.

Figure 6:
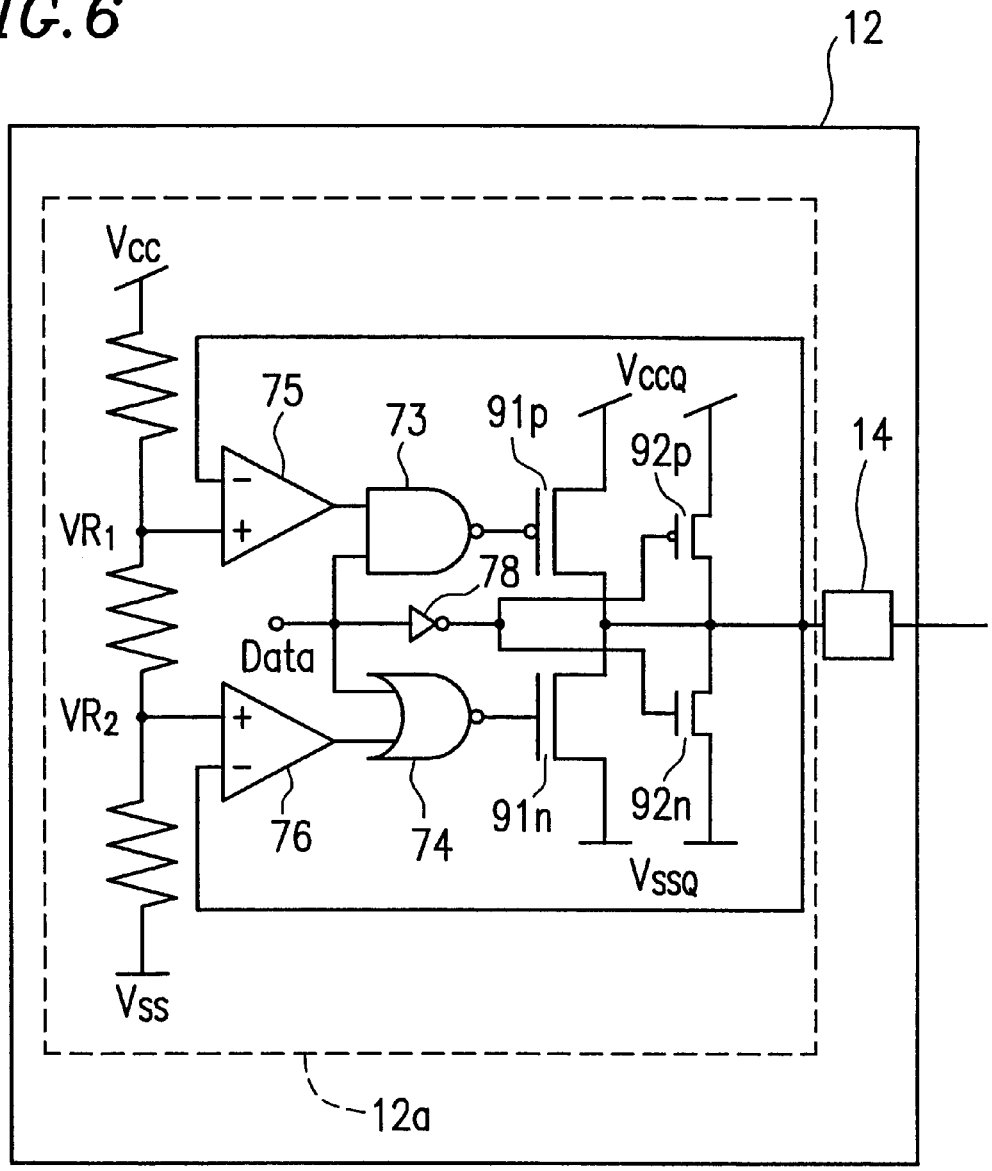
FIG. 6 is a diagram showing a configuration of an output buffer 12a of the driver 10.

FIG. 6 shows a configuration of an output buffer 12a of the driver 10. The output buffer 12 (FIG. 1) can be replaced with the output buffer 12a.

The output buffer 12a includes a push-pull transistor for outputting data onto the transmission line path 30. The push-pull transistor includes two sets of transistors having different sizes. Specifically, the output buffer 12a includes a set of a PMOS transistor 91p and an NMOS transistor 91n having large sizes, and a set of a PMOS transistor 92p and an NMOS transistor 92n having small sizes.

The gates of the transistors 91p and 91n receive predetermined logic values determined by a NAND element 73, a NOR element 74, and operational amplifiers 75 and 76. The operational amplifier 75 receives the potential of the transmission line path 30 and a reference potential $VR_1$. The operational amplifier 76 receives the potential of the transmission line path 30 and a reference potential $VR_2$.

The gates of the transistors 92p and 92n receives the output of an inverter 78. The inverter 78 receives data Data.

In transition of data on the transmission line path 30, the output buffer 12a switches ON either of the transistors 91p and 92p or the transistors 91n and 92n according to the value of data to be transmitted. This allows the potential of the transmission line path 30 to change at a high speed.

When the potential of the transmission line path 30 becomes more than the reference potential $VR_1$, the transistor 91p is switched OFF. The transistor 92p remains ON.

When the potential of the transmission line path 30 becomes less than the reference potential $VR_2$, the transistor 91n is switched OFF. The transistor 92n remains ON.

Such a control allows a micro amount of direct current to flow through the transmission line path 30 via the transistors 92p and 92n during no transition of data.

The transistors 92p and 92n and the diodes 81 and 82 actively maintain the potential of the transmission line path 30 at the potential $(V_{term}+V_f)$ or $(V_{term}-V_f)$. As a result, an improved characteristic is obtained where data is lesser influenced by noise.

Figure 7A:
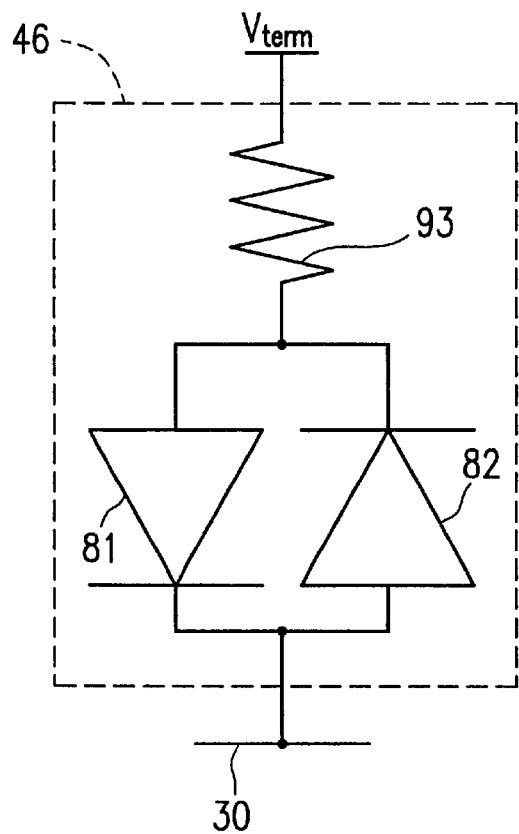
FIG. 7A is a diagram showing a configuration of a variable impedance element 46.
Figure 7B:
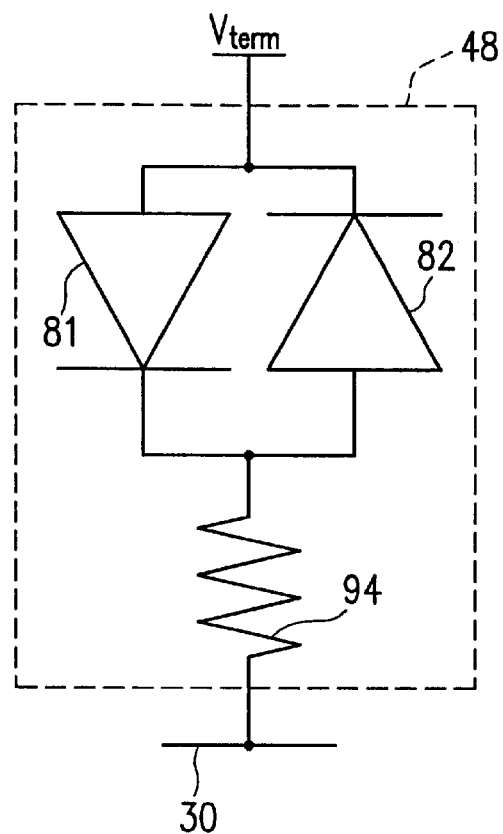
FIG. 7B is a diagram showing a configuration of a variable impedance element 48.

FIG. 7A shows a configuration of a variable impedance element 46. FIG. 7B shows a configuration of a variable impedance element 48. The variable impedance element 44 (FIG. 1) can be replaced with the variable impedance element 46 or 48.

The variable impedance element 46 includes a resistor 93 connected in series to the diodes 81 and 82 connected in parallel. One end of the resistor 93 is connected to the terminal potential $V_{term}$. The other end of the resistor 93 is connected via the diodes 81 and 82 to the transmission line path 30.

The variable impedance element 48 includes a resistor 94 connected in series to the diodes 81 and 82 connected in parallel. One end of the resistor 94 is connected via the diodes 81 and 82 to the terminal potential $V_{term}$. The other end of the resistor 94 is connected to the transmission line path 30.

The variable impedance elements 46 and 48 have extremely high impedances before one of the diodes 81 and 82 is biased in the forward direction. When one of the diodes 81 and 82 is biased in the forward direction, the variable impedance element 46 has an impedance substantially equal to the impedance of the resistor 93 and the variable impedance element 48 has an impedance substantially equal to the impedance of the resistor 94.

Thus, the impedances of the variable impedance elements 46 and 48 after the diodes 81 or 82 have been biased in the forward direction becomes higher as compared with the impedance value of the variable impedance element 44 (FIG. 1). Therefore, it is possible to reduce the peak value of a current into the driver 10 when the diode 81 or 82 is biased in the forward direction.

Further, the resistors 93 and 94 each preferably have a resistance equal to the characteristic impedance Z of the transmission line path 30. This prevents reflection from occurring at an end on the receiver 20 side of the transmission line path 30.

Further, the forward voltage $V_f$ of the diodes 81 and 82 is substantially in agreement with an amplitude of the potential of the transmission line path 30 from the terminal potential $V_{term}$, the amplitude being generated when the driver 10 outputs HIGH-level data, and with an amplitude of the potential of the transmission line path 30 from the terminal potential $V_{term}$, the amplitude being generated when the driver 10 outputs LOW-level data.

Assume, for example, that the impedance of the transmission line path 30 and the impedances of the resistors 93 and 94 both are 50 ohm, the terminal potential $V_{term}$ is 1.1 V, and the output impedance of the driver 10 is 50 ohm. In this case, when the driver 10 outputs HIGH-level data, the potential of the transmission line path 30 is 1.65 V. When the driver 10 outputs LOW-level data, the potential of the transmission line path 30 is 0.55 V. Since the amplitude of data from the terminal potential $V_{term}$ is 0.55 V, the forward direction voltage $V_f$ of the diodes 81 and 82 is preferably set to 0.55 V.

EXAMPLE 2

Figure 8A:
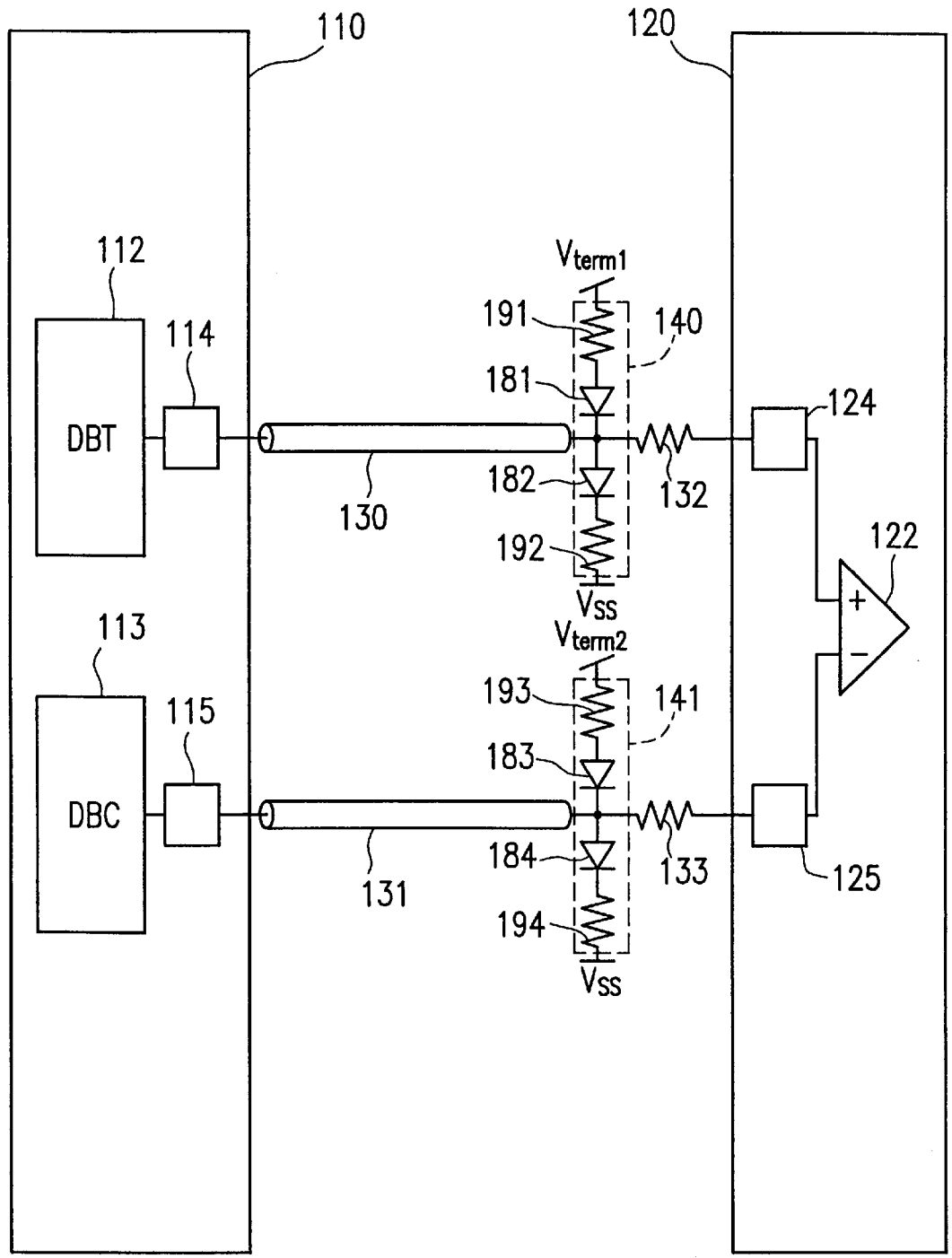
FIG. 8A is a diagram showing a configuration of a data transmission device 2a according to Example 2 of the present invention.

FIG. 8A shows a configuration of a data transmission device 2a according to Example 2 of the present invention. The data transmission device 2a performs data transmission in a so-called differential mode.

The data transmission device 2a includes a driver 110 for sending data, a receiver 120 for receiving the data sent from the driver 110, and transmission line paths 130 and 131 connecting between the driver 110 and the receiver 120. Positive-logic data is transmitted from the driver 110 to the receiver 120 via the transmission line path 130. Negative-logic data is transmitted from the driver 110 to the receiver 120 via the transmission line path 131.

The data transmission device 2a further includes a variable impedance element 140 the impedance of which is automatically changed according to the potential of the transmission line path 130, and a variable impedance element 141 the impedance of which is automatically changed according to the potential of the transmission line path 131. The variable impedance element 140 is connected to an end on the receiver 120 side of the transmission line path 130. The variable impedance element 141 is connected to an end on the receiver 120 side of the transmission line path 131.

The variable impedance element 140 includes diodes 181 and 182. The anode of the diode 181 is connected via the resistor 191 to the terminal potential $V_{term1}$. The cathode of the diode 181 is connected to the transmission line path 130. The anode of the diode 182 is connected to the transmission line path 130. The cathode of the diode 182 is connected via the resistor 192 to ground $V_{SS}$.

Note that the resistors 191 and 192 can be omitted. When the resistor 191 is omitted, the anode of the diode 181 is connected to the terminal potential $V_{term1}$. When the resistor 192 is omitted, the cathode of the diode 182 is connected to ground $V_{SS}$.

The variable impedance element 141 includes diodes 183 and 184. The anode of the diode 183 is connected via the resistor 193 to the terminal potential $V_{term2}$. The cathode of the diode 183 is connected to the transmission line path 131. The anode of the diode 184 is connected to the transmission line path 131. The cathode of the diode 184 is connected via the resistor 194 to ground $V_{SS}$.

Note that the resistors 193 and 194 can be omitted. When the resistor 193 is omitted, the anode of the diode 183 is connected to the terminal potential $V_{term2}$. When the resistor 194 is omitted, the cathode of the diode 184 is connected to ground $V_{SS}$.

The driver 110 includes an output buffer (DBT) 112 for outputting data onto the transmission line path 130 and an output buffer (DBC) 113 for outputting data onto the transmission line path 131. The output buffer 112 is connected via a pad 114 to the transmission line path 130. The output buffer 113 is connected via a pad 115 to the transmission line path 131.

The receiver 120 includes an input buffer 122 for receiving data from the transmission line paths 130 and 131. The input buffer 122 is, for example, an operational amplifier having two inputs.

One of the inputs of the input buffer 122 is connected via a pad 124 and a stub resistor 132 to the transmission line path 130. The other of the inputs of the input buffer 122 is connected via a pad 125 and a stub resistor 133 to the transmission line path 131.

The variable impedance element 140 is designed to satisfy a condition such that the sum of the forward direction voltages $V_f$ of the diodes 181 and 182 is greater than the potential difference between the terminal potential $V_{term1}$ and the ground $V_{SS}$. The variable impedance element 141 is designed to satisfy a condition such that the sum of the forward direction voltages $V_f$ of the diodes 183 and 184 is greater than the potential difference between the terminal potential $V_{term2}$ and the ground $V_{SS}$. For example, the above-described conditions are satisfied when the terminal potentials $V_{term1}$ and $V_{term2}$ each are 1.5 V, and the forward direction voltages $V_f$ of the diodes 181 to 184 each are 1.0 V.

The satisfaction of the above-described conditions prevents a direct current from flowing through the terminal potentials $V_{term1}$ and $V_{term2}$ to the ground $V_{SS}$ when the outputs of the drivers 110, and the transmission line paths 130 and 131 are floating.

Figure 8B:
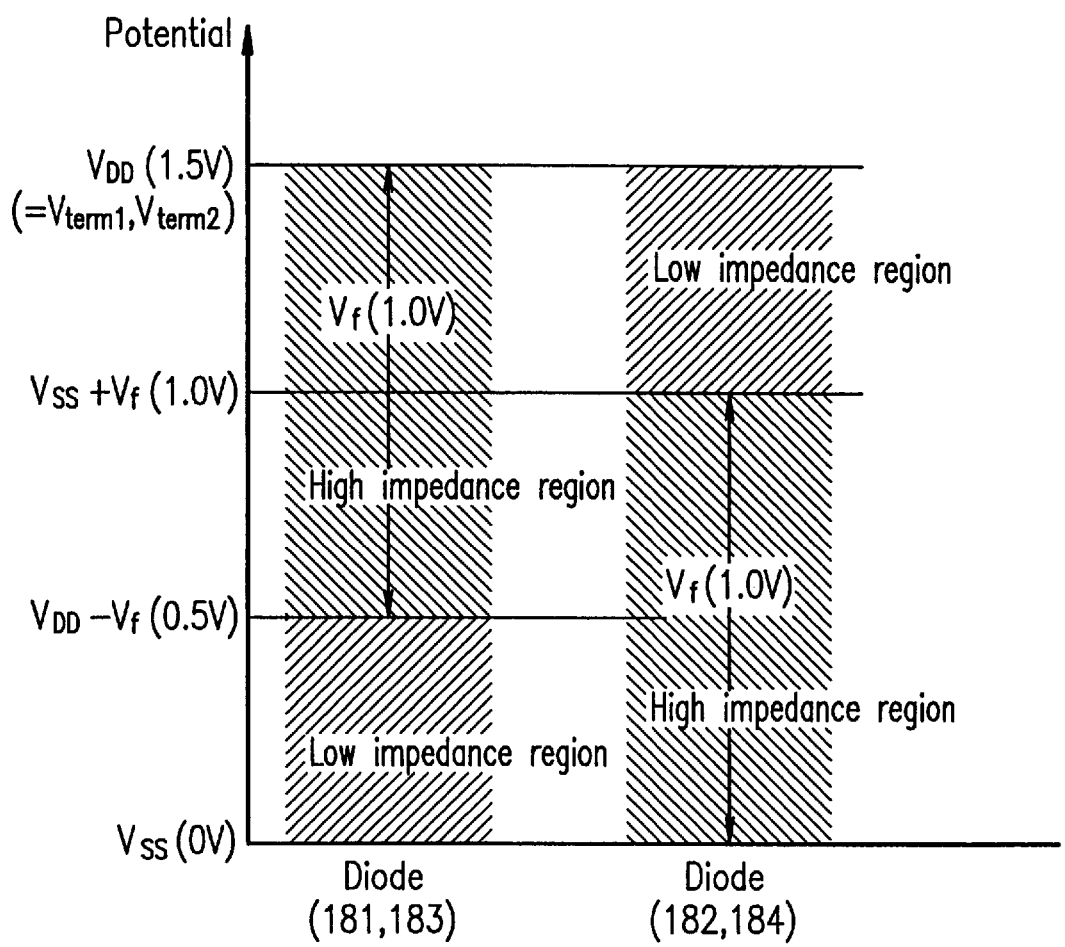
FIG. 8B is a diagram showing impedance characteristics of diodes 181 to 184.

FIG. 8B shows the impedance characteristics of the diodes 181 to 184. In an example shown in FIG. 8B, it is assumed $V_{DD}=V_{term1}=V_{term2}$. Alternatively, the potential $V_{term1}$ may differ from the potential $V_{term2}$.

When the potential of the transmission line path 130 is between the potential $(V_{SS}+V_f)$ and the potential $(V_{term1}-V_f)$, the characteristics of both diodes 181 and 182 connected to the transmission line path 130 are both in a high impedance region (see FIG. 8B). Therefore, in this case, the variable impedance element 140 has an extremely high impedance. As a result, data on the transmission line path 130 transits at a constant high speed.

When the potential of the transmission line path 130 is higher than the potential $(V_{SS}+V_f)$, the characteristic of the diode 182 is in a low impedance region (see FIG. 8B). When the potential of the transmission line path 130 is lower than the potential $(V_{term1}-V_f)$, the characteristic of the diode 181 is in a low impedance region (see FIG. 8B).

As described above, when the potential of the transmission line path 130 is higher than the potential $(V_{SS}+V_f)$, or when the potential of the transmission line path 130 is lower than the potential $(V_{term1}-V_f)$, the characteristic of either the diode 181 or 182 is in a low impedance region. Therefore, in this case, the variable impedance element 140 has an extremely low impedance around the terminal potential $V_{term1}$ or the ground $V_{SS}$. This is because the diode 181 or 182 is biased in the forward direction.

As a result, a potential (Hi-potential) indicating that data on the transmission line path 130 is at the HIGH level is clamped around the potential $(V_{SS}+V_f)$. A potential (Lo-potential) indicating that data on the transmission line path 130 is at the LOW level is clamped around the potential $(V_{term1}-V_f)$. This restricts the amplitude of data.

For example, when $(V_{SS}+V_f)=1.0$ V and $(V_{term1}-V_f)=0.5$ V, a data amplitude is 0.5 V. Thus, data having such a small amplitude of 0.5 V can be transmitted.

Note that the Hi-potential and Lo-potential of the transmission line path 130 are determined by the resistors 191 and 192 and the output impedance of the output buffer 112. For example, the Hi-potential and Lo-potential of the transmission line path 130 can be set to 1.0 V and 0.5 V, respectively, by adjusting the output impedance of the output buffer 112.

Thus, the impedance value of the variable impedance element 140 is changed according to the potential of the transmission line path 130. Similarly, the impedance value of the variable impedance element 141 is changed according to the potential of the transmission line path 131.

Note that in order to prevent data reflection, the resistances of the resistors 191 to 194 are preferably equal to the characteristic impedances of the transmission line paths 130 and 131.

Further, by increasing the output impedance of the output buffer 112 after the potential of the transmission line path 130 becomes greater than the potential $(V_{SS}+V_f)$ or less than the potential $(V_{term1}-V_f)$, a direct current consumed by the driver 110 may be significantly removed.

Similarly, by increasing the output impedance of the output buffer 113 after the potential of the transmission line path 131 becomes greater than the potential $(V_{SS}+V_f)$ or less than the potential $(V_{term2}-V_f)$, a direct current consumed by the driver 110 may be significantly removed.

Figure 9:
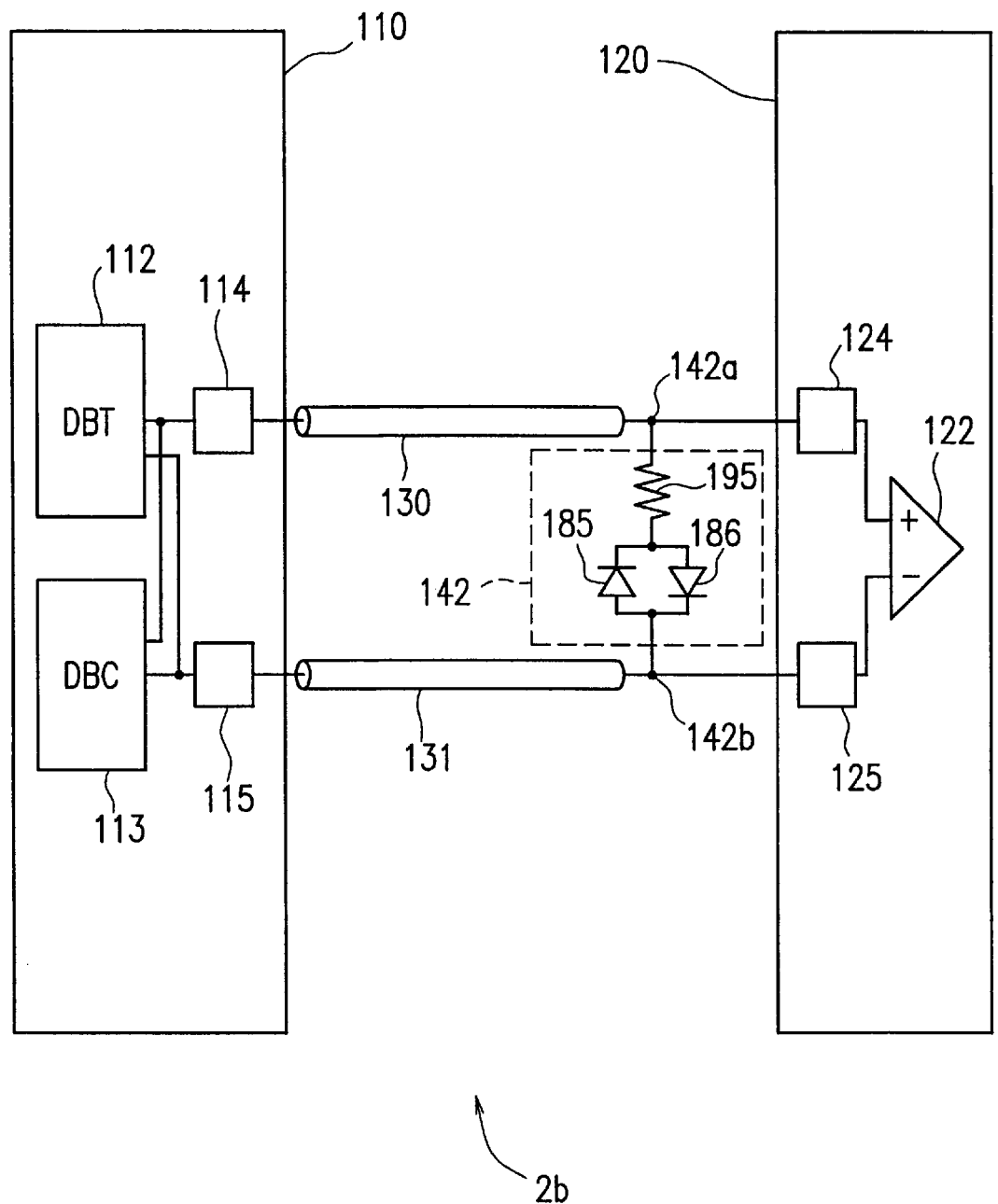
FIG. 9 is a diagram showing a configuration of a data transmission device 2b according to Example 2 of the present invention.

FIG. 9 shows a configuration of a data transmission device 2b according to Example 2 of the present invention. The data transmission device 2b performs data transmission in a so-called differential mode.

The data transmission device 2b includes a variable impedance element 142. An end 142a of the variable impedance element 142 is connected to the transmission line path 130. The other end 142b of the variable impedance element 142 is connected to the transmission line path 131.

The variable impedance element 142 includes diodes 185 and 186 connected in parallel and a resistor 195. The configuration of the variable impedance element 142 is similar to that of the variable impedance element 46 shown in FIG. 7A. The variable impedance element 142 can be replaced with the variable impedance element 40 (FIG. 1) or the variable impedance element 48 (FIG. 7B).

In the data transmission device 2b, output buffers 112 and 113 can monitor both the potentials of the transmission line paths 130 and 131. The output impedances of the output buffers 112 and 113 are set to high values after the potential difference between the potentials of the transmission line paths 130 and 131 becomes greater than the forward voltage $V_f$ of the diodes 185 and 186. Therefore, a direct current consumed by the driver 110 is significantly removed.

Figure 10:
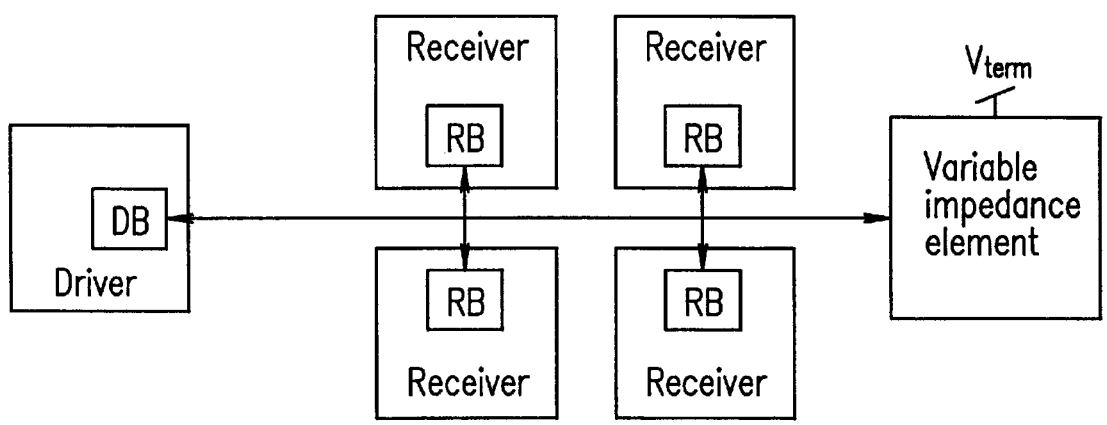
FIG. 10 is a diagram showing a configuration of a data transmission device according to another example of the present invention.

In Examples 1 and 2, it is described that data is transmitted from one driver to one receiver (so-called point-to-point data transmission. This invention is not limited to the point-to-point data transmission). For example, this invention can be applied to the case as shown in FIG. 10 where data is transmitted from one driver to a plurality of receivers via a transmission line path. In this case, the above-described variable impedance element is provided at an end of the transmission line path.

INDUSTRIAL APPLICABILITY

As described above, a data transmission device according to the present invention can prevent a direct current from flowing through a transmission line path, thereby reducing power consumption. The data transmission device of the present invention can prevent occurrence of skew when data is latched using a clock signal, resulting in high-speed data transmission.

What is claimed is:

1. A data transmission device comprising:

a driver for sending data;

a receiver for receiving data sent from the driver;

a transmission line path for connecting between the driver and the receiver; and a variable impedance element having a controllably variable impedance, wherein:

the variable impedance element is connected to the transmission line path; and the variable impedance element is controlled to have an impedance substantially equal to a characteristic impedance of the transmission line path when the voltage of the transmission line path is outside a predetermined range.

2. A data transmission device according to claim 1, wherein the impedance value of the variable impedance element is changed according to a potential of the transmission line path.

3. A data transmission device according to claim 1, wherein the impedance value of the variable impedance element is changed according to a control signal input from the outside of the variable impedance element.

4. A data transmission device according to claim 1, wherein the impedance value of the variable impedance element and an output impedance of the driver are changed in association with each other.

5. A data transmission device according to claim 4, wherein the output impedance of the driver is changed according to the impedance value of the variable impedance element.

6. A data transmission device according to claim 1, wherein the variable impedance element includes a first diode and a second diode connected in parallel, a direction of a current flowing through the first diode is opposite to a direction of a current flowing through the second diode.

7. A data transmission device according to claim 6, wherein the variable impedance element further includes a resistor connected in series to the first and second diodes connected in parallel.

8. A data transmission device according to claim 7, wherein a resistance of the resistor is substantially equal to a characteristic impedance of the transmission line path; and a forward direction voltage of the first and second diodes is substantially equal to an amplitude of a potential of the transmission line path from a predetermined terminal voltage, the amplitude being generated when the driver outputs the data onto the transmission line path.

9. A data transmission device comprising:
a driver for sending data;
a receiver for receiving data sent from the driver;
first and second transmission line paths for connecting between the driver and the receiver;
a first variable impedance element having a first controllably variable impedance;
a second variable impedance element having a second controllably variable impedance,
wherein:
the first variable impedance element is connected to the first transmission line path, and the second variable impedance element is connected to the second transmission line path;
the first variable impedance element is controlled to have an impedance substantially equal to a characteristic impedance of the first transmission line path when the voltage of the first transmission line path is outside a first predetermined range; and the second variable impedance element is controlled to have an impedance substantially equal to a characteristic impedance of the second transmission line path when the voltage of the first transmission line path is outside a second predetermined range.

10. A data transmission device according to claim 9, wherein
the first variable impedance element includes first and second diodes; the anode of the first diode is connected to a predetermined first potential; the cathode of the first diode is connected to the first transmission line path; the anode of the second diode is connected to the first transmission line path; and the cathode of the second diode is connected to a predetermined second potential lower than the predetermined first potential;

the sum of the forward direction voltages of the first and second diodes is greater than a potential difference between the predetermined first potential and the predetermined second potential;

the second variable impedance element includes third and fourth diodes; the anode of the third diode is connected to a predetermined third potential; the cathode of the third diode is connected to the second transmission line path; the anode of the fourth diode is connected to the second transmission line path; and the cathode of the fourth diode is connected to a predetermined fourth potential lower than the predetermined third potential; and the sum of the forward direction voltages of the third and fourth diodes is greater than a potential difference between the predetermined third potential and the predetermined fourth potential.

11. A data transmission device according to claim 9, wherein:
the driver includes a first buffer for outputting data onto the first transmission line path and a second buffer for outputting data onto the second transmission line path;
the impedance value of the first variable impedance element and an output impedance of the first buffer are changed in association with each other; and
the impedance value of the second variable impedance element and an output impedance of the second buffer are changed in association with each other.

12. A data transmission device comprising:
a driver for sending data;
a receiver for receiving data sent from the driver;
a transmission line path for connecting between the driver and the receiver; and
a variable impedance element having a controllably variable impedance,
wherein:
the variable impedance element is connected to the transmission line path;
the variable impedance element includes a first diode and a second diode connected in parallel, a direction of a current flowing through the first diode is opposite to a direction of a current flowing though the second diode;
the variable impedance element further includes a resistor connected in series to the first and second diodes connected in parallel;
a resistance of the resistor is substantially equal to a characteristic impedance of the transmission line path; and
a forward direction voltage of the first and second diodes is substantially equal to an amplitude of a potential of the transmission line path from a predetermined terminal voltage, the amplitude being generated when the driver outputs the data onto the transmission line path.

13. A data transmission device comprising:
a driver for sending data;
a receiver for receiving data sent from the driver;
first and second transmission line paths for connecting between the driver and the receiver;
a first variable impedance element having a first controllably variable impedance; and a second variable impedance element having a second controllably variable impedance, wherein:

the first variable impedance element is connected to the first transmission line path, and the second variable impedance element is connected to the second transmission line path;

the first variable impedance element includes first and second diodes wherein the anode of the first diode is connected to a predetermined first potential, the cathode of the first diode is connected to the first transmission line path, the anode of the second diode is connected to the first transmission line path, and the cathode of the second diode is connected to a predetermined second potential lower than the predetermined first potential;

the sum of the forward direction voltages of the first and second diodes is greater than a potential difference between the predetermined first potential and the predetermined second potential;

the second variable impedance element includes third and fourth diodes: the anode of the third diode is connected to a predetermined third potential; the cathode of the third diode is connected to the second transmission line path; the anode of the fourth diode is connected to the second transmission line path; and the cathode of the fourth diode is connected to a predetermined fourth potential lower than the predetermined third potential; and the sum of the forward direction voltages of the third and fourth voltages is greater than a potential difference between the predetermined third potential and the predetermined fourth potential.

* * * * *